(12) United States Patent
Song et al.

(10) Patent No.: US 12,500,586 B2
(45) Date of Patent: Dec. 16, 2025

(54) RESISTOR VOLTAGE-BEARING TYPE ON-STATE VOLTAGE DROP MEASUREMENT CIRCUIT FOR JUNCTION TEMPERATURE MONITORING AND MONITORING METHOD

(71) Applicant: Southwest Jiaotong University, Chengdu (CN)

(72) Inventors: Wensheng Song, Chengdu (CN); Haoyang Tan, Chengdu (CN); Kexin Yang, Chengdu (CN); Jian Chen, Chengdu (CN); Tao Tang, Chengdu (CN); Pengcheng Xu, Chengdu (CN); Chenwei Ma, Chengdu (CN); Xinglai Ge, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 0 days.

(21) Appl. No.: 19/047,758

(22) Filed: Feb. 7, 2025

(65) Prior Publication Data
US 2025/0251290 A1    Aug. 7, 2025

Related U.S. Application Data

(63) Continuation of application No. PCT/CN2024/135530, filed on Nov. 29, 2024.

(30) Foreign Application Priority Data

Feb. 4, 2024 (CN) .......................... 202410156868.4

(51) Int. Cl.
    *H03K 17/18*      (2006.01)
    *H02M 1/00*      (2006.01)
    *H02M 1/32*      (2007.01)

(52) U.S. Cl.
    CPC .......... *H03K 17/18* (2013.01); *H02M 1/0009* (2021.05); *H02M 1/32* (2013.01); *H03K 2217/0027* (2013.01)

(58) Field of Classification Search
None
See application file for complete search history.

(56) References Cited

U.S. PATENT DOCUMENTS

| | | | | | |
|---|---|---|---|---|---|
| 5,030,844 | A | * | 7/1991 | Li ........................ | H03K 17/567 |
| | | | | | 307/115 |
| 9,881,916 | B2 | * | 1/2018 | Naito .................... | H10D 84/403 |
| | | | | (Continued) | |

FOREIGN PATENT DOCUMENTS

| | | |
|---|---|---|
| CN | 104155587 B | 11/2014 |
| CN | 111812479 B | 10/2020 |
| | (Continued) | |

OTHER PUBLICATIONS

Chai Xiaoguang, Ning Puqi, Cao Han, Wen Xuhui "Research on Junction Temperature Monitoring Method for IGBT Power Module Based on On-state Voltage Drop at High Current" Journal of Power Supply, vol. 18 No. 4, Jul. 30. 2020 (Jul. 30, 2020), pp. 81-88.

*Primary Examiner* — Thomas J. Hiltunen
(74) *Attorney, Agent, or Firm* — Birchwood IP (57) ABSTRACT

The present invention discloses a resistor voltage-bearing type on-state voltage drop measurement circuit for junction temperature monitoring and a monitoring method. The measurement circuit includes a high-resistance series high-voltage resistor $R_L$, switching diodes $D_1$ and $D_2$, a low-voltage MOSFET $M_1$, an inverter $U_1$, a three-state gate $U_2$, an RC delay circuit consisting of a resistor $R_1$ and a capacitor $C_1$, current-limiting resistors $R_2$ and $R_3$, auxiliary voltage sources VDD and VCC, an operational amplifier $U_3$, and an isolation operational amplifier $U_4$. and the monitoring method includes: designing an on-state voltage drop (Continued)

sampling circuit based on the high-resistance resistor and selecting parameters according to an actual application scenario; measuring a collector current and an on-state voltage drop model at different junction temperatures under an offline condition, and providing a calculation model for online monitoring; and performing online monitoring on the junction temperature.

3 Claims, 9 Drawing Sheets

(56) References Cited

U.S. PATENT DOCUMENTS

| | | |
|---|---|---|
| 10,193,547 B2 * | 1/2019 | Wang .................. H03K 17/567 |
| 10,644,689 B2 * | 5/2020 | Shinomiya ............. H03K 17/06 |
| 11,728,748 B2 * | 8/2023 | Hain ..................... H02M 7/539 |
| | | 307/9.1 |
| 11,973,011 B2 * | 4/2024 | Sato ........................ H01L 24/40 |
| 11,979,017 B2 * | 5/2024 | Yano ................. H03K 17/0822 |
| 12,126,330 B2 * | 10/2024 | Kumazawa ...... H03K 17/08126 |
| 12,199,526 B2 * | 1/2025 | Wada .................. H10D 30/669 |
| 2017/0358512 A1 * | 12/2017 | Kakimoto ............. H10D 84/00 |
| 2020/0366279 A1 | 11/2020 | Ma |
| 2022/0236756 A1 | 7/2022 | He |

FOREIGN PATENT DOCUMENTS

| | | |
|---|---|---|
| CN | 113466647 B | 10/2021 |
| CN | 115598488 A | 1/2023 |

\* cited by examiner

RESISTOR VOLTAGE-BEARING TYPE ON-STATE VOLTAGE DROP MEASUREMENT CIRCUIT FOR JUNCTION TEMPERATURE MONITORING AND MONITORING METHOD

CROSS-REFERENCE TO RELATED APPLICATIONS

This application is a continuation of International Application No. PCT/CN2024/135530, filed on Nov. 29, 2024, which claims priority to Chinese Patent Application No. 202410156868.4, filed with the China National Intellectual Property Administration on Feb. 4, 2024. Both of which are hereby incorporated by reference in their entireties.

TECHNICAL FIELD

The present invention belongs to the field of online monitoring of power device junction temperature, and particularly relates to a resistor voltage-bearing type on-state voltage drop measurement circuit for junction temperature monitoring and a monitoring method.

BACKGROUND

An insulated gate bipolar transistor (IGBT) is a power semiconductor device most widely used in a power system, and is widely applied to high-power conversion scenarios such as rail transit. The reliability of the IGBT is always a main factor for restricting improvement of the reliability of a converter. Statistically, more than 33% of converter failures come from IGBT. The lifetime and reliability of power semiconductor devices are mainly affected by the average junction temperature and temperature fluctuations. Therefore, it is an effective method to improve the lifetime of IGBT by monitoring and controlling the junction temperature.

The existing IGBT junction temperature monitoring methods mainly include four types: a built-in thermistor method, an optical thermometry method, a thermal impedance network model method, and a thermo-sensitive electrical parameter method. Among these methods, the thermistor method has a low response speed, the thermistor is far away from a chip, and a difference between a measurement result and actual IGBT junction temperature is large; consequently, the obtained temperature has no great reference significance. The optical thermometry is expensive and generally used in a laboratory environment because the optical thermometry requires destructive processing of the chip. The thermal impedance network method cannot directly obtain junction temperature information, and cannot meet a requirement for online measurement of IGBT junction temperature due to the influence of aging. Among these methods, the thermo-sensitive electrical parameters have attracted much attention due to high precision, fast response speed, and strong online monitoring capabilities.

In the existing thermo-sensitive electrical parameter, the on-state voltage drop is the most concerned due to excellent comprehensive performance in sensitivity and response speed. In addition, the on-state voltage drop is the only online monitoring method for IGBT junction temperature that has been applied in practical engineering. The current on-state voltage drop measurement is classified into measurement under low current and measurement under high current. The on-state voltage drop measurement under low current has become a standard measurement method and is widely applied to various offline measurements of IGBT due to extremely high accuracy and the fact that the measurement current does not interfere with the IGBT junction temperature. However, during the actual online operation of the converter, the IGBT is in a large-current and high-voltage working condition. To achieve the online monitoring of the IGBT junction temperature by using the on-state voltage drop, the on-state voltage drop online monitoring circuit is required to have good high-voltage isolation capability and extremely high measurement accuracy.

At present, the online measurement circuit for on-state voltage drop is mainly used for measuring the on-state voltage drop of low-voltage IGBT. The high-voltage isolation design and circuit reliability of the online measurement circuit for on-state voltage drop are important factors that restrict the application of the measurement circuit in high-voltage occasions.

SUMMARY

To solve the above problems, the present invention provides a resistor voltage-bearing type on-state voltage drop measurement circuit for junction temperature monitoring and a monitoring method.

A resistor voltage-bearing type on-state voltage drop measurement circuit for junction temperature monitoring according to the present invention includes a high-resistance series high-voltage resistor $R_L$, a switching diode $D_1$, a switching diode $D_2$, a low-voltage metal-oxide-semiconductor field-effect transistor (MOSFET) $M_1$, an inverter $U_1$, a three-state gate $U_2$, an RC delay circuit consisting of a resistor $R_1$ and a capacitor $C_1$, a current-limiting resistor $R_2$, a current-limiting resistor $R_3$, auxiliary voltage sources VDD and VCC, an operational amplifier $U_3$, and an isolation operational amplifier $U_4$. One end of the high-resistance series high-voltage resistor $R_L$ is connected to a collector of IGBT, the other end of the high-resistance series high-voltage resistor $R_L$ is connected to a positive electrode of the switching diode $D_1$, a negative electrode of the switching diode $D_1$ is connected to a drain of the low-voltage MOSFET $M_1$, and a source of the low-voltage MOSFET $M_1$ is connected to an emitter of the IGBT; a connection between a positive electrode of the switching diode $D_1$ and the high-resistance series high-voltage resistor $R_L$ is a test point and is connected to an input end of the operational amplifier $U_3$ of an isolation part, a negative electrode of the switching diode $D_2$ is connected to the test point, and a positive electrode of the switching diode $D_2$ is connected to power reference ground; and the auxiliary voltage source VDD is connected to the negative electrode of the switching diode $D_1$ by the current-limiting resistor $R_3$.

In a circuit of a logic part, an input signal of the circuit is from a control signal of IGBT sent by a controller, the signal is inverted by the inverter $U_1$, and then input to an input end of the three-state gate $U_2$ by the series RC delay circuit, and an input signal of a control end of the three-state gate $U_2$ is the control signal of the IGBT; after passing through three-state gate $U_2$, the control signal becomes a control signal with a delay added to a falling edge of the signal after inversion, and this control signal is finally used for switching control of the low-voltage MOSFET $M_1$.

In a circuit of an isolation part, an input signal of the circuit is from a test point voltage $v_{TP}$ of a measurement part, and the operational amplifier $U_3$ is connected as a voltage follower, and a voltage of the voltage follower is finally used for on-state voltage drop detection by the isolation operational amplifier $U_4$.

In addition, the circuit also has an output parasitic capacitance $C_O$ from the low-voltage MOSFET $M_1$, a junction capacitance $C_R$ of the switching diode $D_1$ and the switching diode $D_2$, an input capacitance of the operational amplifier $U_3$ and a PCB parasitic capacitance $C_S$, which are connected to the test point voltage $v_{TP}$.

When the IGBT is on-state, the low-voltage MOSFET $M_1$ is turned off according to the control signal, the switching diode $D_1$ is in a reverse bias state, and the test point voltage $v_{TP}$ is equivalent IGBT on-state voltage drop $v_{CE-ON}$; when the IGBT is turned off, the low-voltage MOSFET $M_1$ is controlled to be turned on and turned off according to the control signal, the switching diode $D_1$ is in a forward bias state, high voltage between the collector and the emitter of the IGBT is born by the high-resistance series high-voltage resistor $R_L$, and the test point voltage is clamped to the on-state voltage drop of the switching diode $D_1$; during the whole process, the high-resistance series high-voltage resistor $R_L$ bears high voltage only in the IGBT turn-off process and does not bear high voltage in other periods; and a control signal of the low-voltage MOSFET $M_1$ is formed by a gate control signal of the IGBT after conditioning of the logic part.

An IGBT junction temperature online monitoring method based on the resistor voltage-bearing type on-state voltage drop measurement circuit includes the following steps:

Step 1: designing an on-state voltage drop sampling circuit based on the high-resistance series high-voltage resistor $R_L$ and selecting parameters according to an actual application scenario.

According to a power rating of an actual device, high-resistance series high-voltage resistors $R_L$ with different resistances are selected to limit a power dissipation on the resistor to a constant value, a resistance of the high-resistance series high-voltage resistor $R_L$ is calculated using the power dissipation combined with an isolation voltage, specifically:

$$R = \frac{V_{CE}}{P}$$

wherein P is an allowed power dissipation on the resistor, and $V_{CE}$ is a voltage between the collector and the emitter.

For the switching diode $D_1$ and the switching diode $D_2$, any switching diode with a withstand voltage of about 90 V and a rated current level of mA meets requirements.

The operational amplifier $U_3$ requires a bandwidth of more than 1 MHZ, an input impedance greater than 1000 MΩ, an input capacitance of less than 4 PF, and an input bias current level of nA; and the isolation operational amplifier $U_4$ only needs to meet a requirement of a system on isolation voltage.

For parameter selection of the RC delay circuit, a delay is added to the low-voltage MOSFET $M_1$ when the IGBT is turned on, and a delay time of the RC delay circuit is represented as:

$$T_D = RC$$

Specific values of parameters of the capacitor and the resistor may be calculated according to a formula.

Step 2: measuring a collector current $i_C$ and an on-state voltage drop model at different junction temperatures under an offline condition, and providing a calculation model for online monitoring.

When IGBT operates in a saturation region, the on-state voltage drop $v_{CE-ON}$ is represented as:

$$v_{CE-ON} = \frac{mkT_j}{q}\ln\left(\frac{i_C}{i_S}+1\right) + i_C(R_N + R_{CH})$$

wherein m is an injection coefficient, k is a Boltzmann constant, $T_j$ is a junction temperature, q is a charge, $i_C$ is the collector current, $i_S$ is a reverse saturation current, $R_N$ is a module package resistance of the IGBT module, and $R_{CH}$ is an internal on-resistance of the IGBT.

A partial derivative of the collector current $i_C$ is calculated for the on-state voltage drop $v_{CE-ON}$, wherein a change rate of the on-state voltage drop $v_{CE-ON}$ to the collector current $i_C$ is represented as:

$$k_{CE} = \frac{\partial v_{CE-ON}}{\partial i_C} = \frac{nkT_j}{qi_S}\frac{1}{i_C+i_S} + (R_N + R_{CH})$$

It can be seen that the change rate of the on-state voltage drop $v_{CE-ON}$ to the collector current $i_C$ changes with $i_C$; when the collector current $i_C$ is within a small change range, the change rate is regarded as a constant, and the on-state voltage drop is represented by piecewise linearization based on the collector current $i_C$ as follows:

$$v_{CE-ON}(i_C) = k_n i_C + V_{INT-n} \quad n = 1, 2 \ldots n$$

wherein $k_n$ is the change rate of on-state voltage drop $v_{CE-ON}$ to the collector current $i_C$ within different collector current $i_C$ ranges, which is a specific value of $k_{CE}$ in a certain collector current $i_C$ region, and n represents different current ranges; $V_{INT-n}$ is a constant term of an expression in each collector current $i_C$ range; $k_n$ and $V_{INT-n}$ are different in different collector current $i_C$ ranges; for $k_n$, when the collector current $i_C$ is within a small change range, $k_n$ is considered to be a constant independent of the collector current $i_C$ but related to the junction temperature $T_j$ according to $k_{CE}$ expression.

$k_n$ is calculated using a least square method by sampling the on-state voltage drop $v_{CE-ON}$ and the collector current $i_C$ multiple times within a certain current range and is represented as:

$$k_n = \frac{\overline{v_{CE-ON} i_C} - \overline{v_{CE-ON}}\,\overline{i_C}}{\overline{i_C^2} - (\overline{i_C})^2}$$

a fitting coefficient $R_n^2$ is represented as:

$$R_n^2 = 1 - \frac{\sum(v_{CE-ON} - \overline{v_{CE-ON}})^2}{\sum(v_{CE-ON} - f(i_C))^2}$$

Step 3: performing online monitoring on the junction temperature under online conditions based on the model obtained from offline condition testing.

In the online monitoring experiment, a power cycle experiment based on a Buck circuit is used to verify the online monitoring effect of the proposed monitoring circuit and monitoring method on the junction temperature, the Buck power cycle test bench dissipates heat from the IGBT by a heat sink, and a temperature of the IGBT is increased or decreased when the IGBT is running continuously by changing a power of the heat sink.

The beneficial technical effects of the present invention are as follows:

The present invention achieves the high-voltage isolation between the collector and the emitter during an IGBT turn-off period and the measurement of the on-state voltage drop during an IGBT turn-on period by utilizing a high-resistance series high-voltage resistor in conjunction with an auxiliary low-voltage device. The proposed circuit has the advantages of low cost, high reliability and adaptability to the measurement of on-state voltage drop in high voltage and a wide ambient temperature range. Compared with the existing circuit, the circuit according to the present invention has better potential for achieving online measurement of junction temperature by utilizing the on-state voltage drop in high-voltage IGBT applications.

DESCRIPTION OF EMBODIMENTS

The present invention is further described below with reference to the accompanying drawings and specific embodiments.

Figure 1:
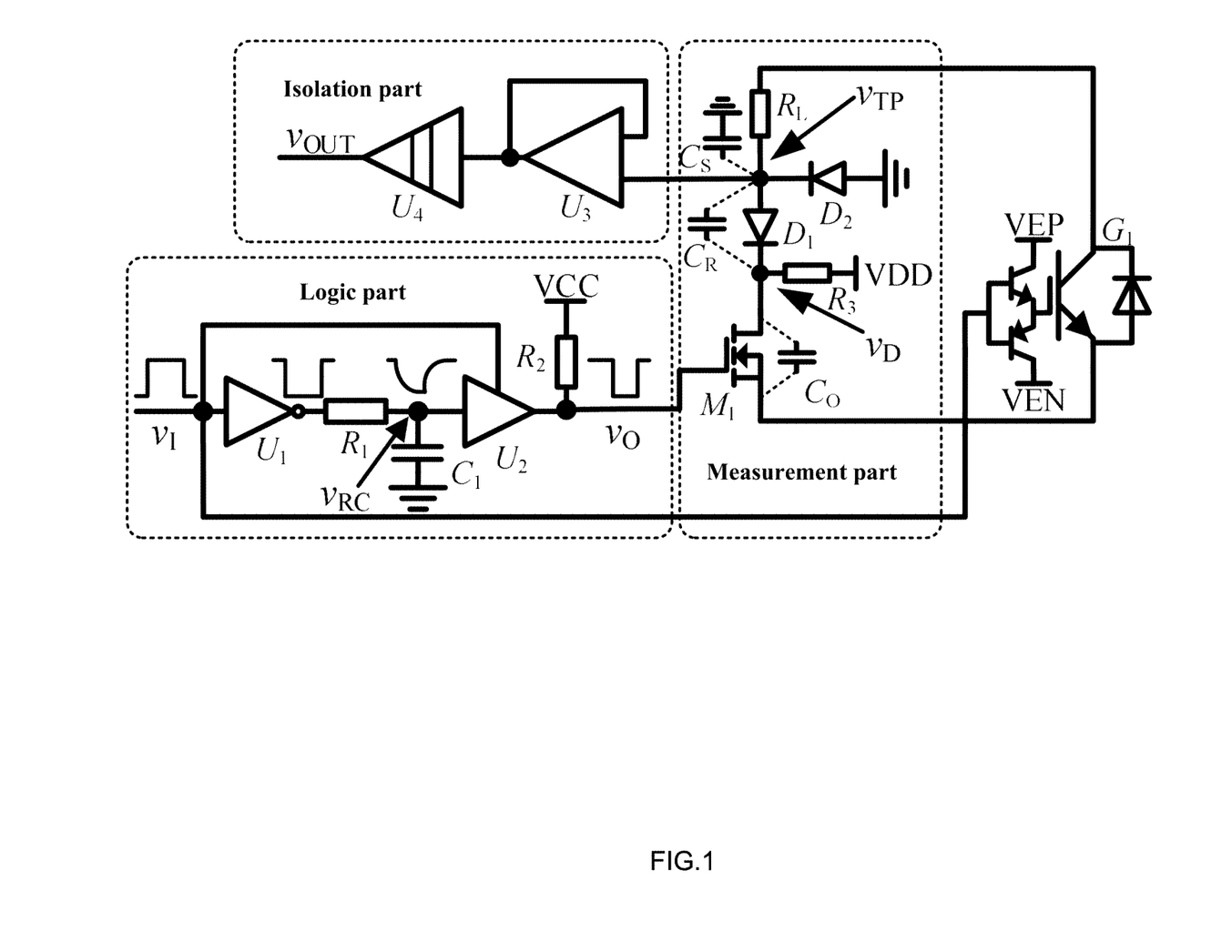
FIG. 1 is a structural diagram of a resistor voltage-bearing type on-state voltage drop measurement circuit for junction temperature monitoring according to the present invention.

As shown in FIG. 1, a resistor voltage-bearing type on-state voltage drop measurement circuit for junction temperature monitoring according to the present invention includes a high-resistance series high-voltage resistor $R_L$, a switching diode $D_1$, a switching diode $D_2$, a low-voltage MOSFET $M_1$, an inverter $U_1$, a three-state gate $U_2$, an RC delay circuit consisting of a resistor $R_1$ and a capacitor $C_1$, a current-limiting resistor $R_2$, a current-limiting resistor $R_3$, auxiliary voltage sources VDD and VCC, an operational amplifier $U_3$, and an isolation operational amplifier $U_4$. One end of the high-resistance series high-voltage resistor $R_L$ is connected to a collector of IGBT, the other end of the high-resistance series high-voltage resistor $R_L$ is connected to a positive electrode of the switching diode $D_1$, a negative electrode of the switching diode $D_1$ is connected to a drain of the low-voltage MOSFET $M_1$, and a source of the low-voltage MOSFET $M_1$ is connected to an emitter of the IGBT; a connection between a positive electrode of the switching diode $D_1$ and the high-resistance series high-voltage resistor $R_L$ is a test point and is connected to an input end of the operational amplifier $U_3$ of an isolation part, a negative electrode of the switching diode $D_2$ is connected to the test point, and a positive electrode of the switching diode $D_2$ is connected to power reference ground; and the auxiliary voltage source VDD is connected to the negative electrode of the switching diode $D_1$ by the current-limiting resistor $R_3$.

In a circuit of a logic part, an input signal of the circuit is from a control signal of IGBT sent by a controller, the signal is inverted by the inverter $U_1$, and then input to an input end of the three-state gate $U_2$ by the series RC delay circuit, and an input signal of a control end of the three-state gate $U_2$ is the control signal of the IGBT; after passing through three-state gate $U_2$, the control signal becomes a control signal with a delay added to a falling edge of the signal after inversion, and this control signal is finally used for switching control of the low-voltage MOSFET $M_1$.

In a circuit of an isolation part, an input signal of the circuit is from a test point voltage $v_{TP}$ of a measurement part, and the operational amplifier $U_3$ is connected as a voltage follower, and a voltage of the voltage follower is finally used for on-state voltage drop detection by the isolation operational amplifier $U_4$.

In addition, the circuit also has an output parasitic capacitance $C_O$ from the low-voltage MOSFET $M_1$, a junction capacitance CR of the switching diode $D_1$ and the switching diode $D_2$, an input capacitance of the operational amplifier $U_3$ and a PCB parasitic capacitance $C_S$, which are connected to the test point.

When the IGBT is on-state, the low-voltage MOSFET $M_1$ is turned off according to the control signal, the switching diode $D_1$ is in a reverse bias state, and the test point voltage $v_{TP}$ is equivalent on-state voltage drop $v_{CE-ON}$; when the IGBT is turned off, the low-voltage MOSFET $M_1$ is turned on and turned off according to the control signal, the switching diode $D_1$ is in a forward bias state, high voltage between the collector and the emitter of the IGBT is born by the high-resistance series high-voltage resistor $R_L$, and the test point voltage is clamped to the on-state voltage drop of the diode; during the whole process, the high-resistance series high-voltage resistor $R_L$ bears high voltage only in the IGBT turn-off process and does not bear high voltage in other periods; and a control signal of the low-voltage MOSFET $M_1$ is formed by a gate control signal of the IGBT after conditioning of the logic part.

The high-resistance series high-voltage resistor $R_L$ is the only high-resistance device used in this circuit, and other auxiliary devices are low-voltage devices. Voltage bearing by using a resistor has the advantages of low cost, high reliability, and good parameter consistency. The other auxiliary devices are all low-voltage devices, which have excellent performance, good parameter consistency, and small parameter changes with temperature. Therefore, the entire circuit can operate at a wide range of ambient temperatures, and meanwhile it is easier to ensure the consistency of performance of different measurement circuits during mass production. The resistance of the high-resistance series high-voltage resistor $R_L$ ranges from hundreds of kilo-ohms to several mega-ohms, and the high-resistance series high-voltage resistor $R_L$ has a very large resistance and cannot cause interference on the normal operation of the IGBT.

An IGBT junction temperature online monitoring method based on the resistor voltage-bearing type on-state voltage drop measurement circuit includes the following steps:

Step 1: designing an on-state voltage drop sampling circuit based on the high-resistance series high-voltage resistor and selecting parameters according to an actual application scenario.

Figure 2:
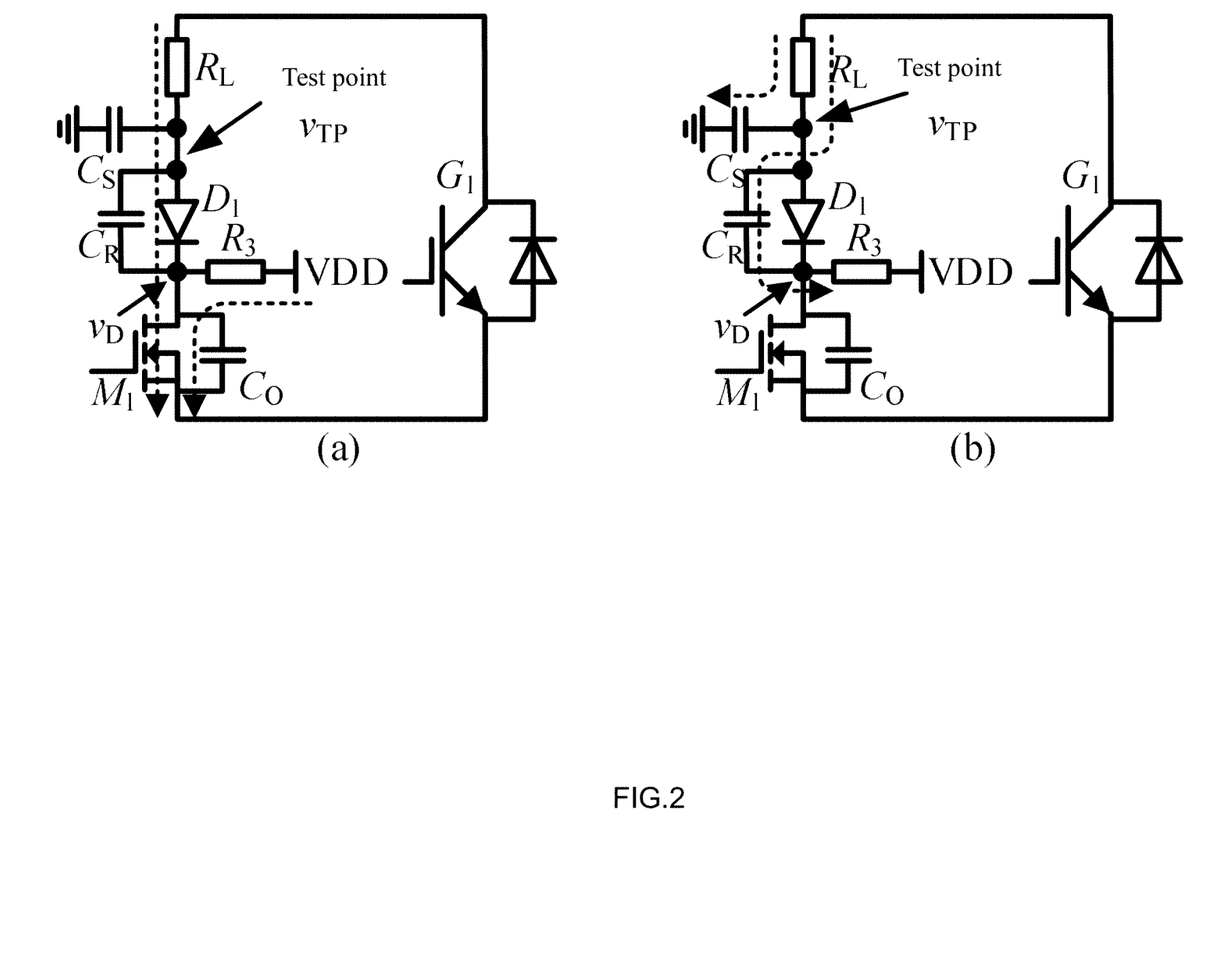
FIG. 2 is a circuit state diagram of a measurement circuit in IGBT turn-off and turn-on states.

FIG. 2 is a circuit state diagram of a measurement circuit in IGBT turn-off and turn-on states. FIG. 2(a) shows a state of a circuit in a high voltage isolation mode, and FIG. 2(b) shows a state of a circuit in an on-state voltage drop measurement mode.

Figure 3:
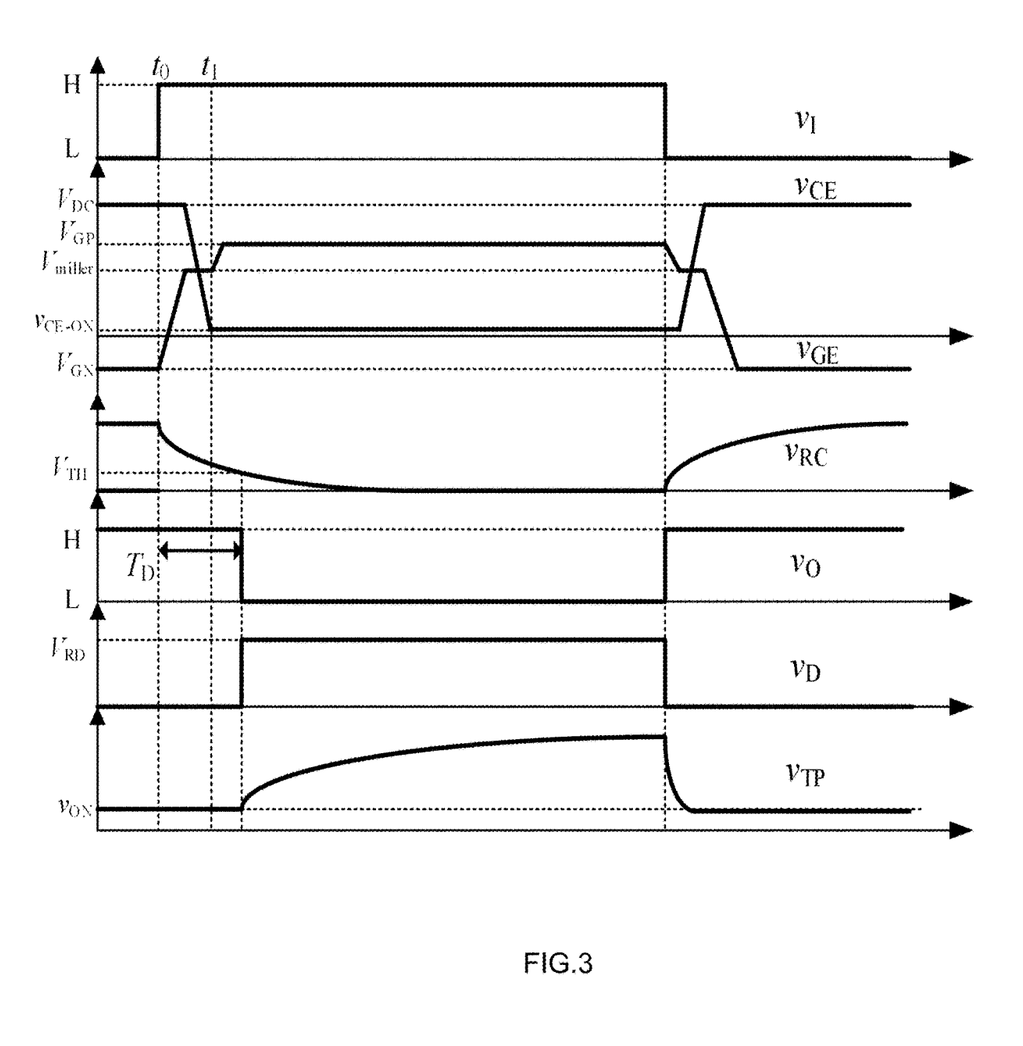
FIG. 3 is an ideal waveform diagram of key nodes of a measurement circuit.

The measurement circuit in the present invention achieves the forward bias and reverse bias control of the diode $D_1$ by utilizing the turn-on and turn-off control of the low-voltage MOSFET $M_1$, thereby achieving the measurement of the on-state voltage drop and the isolation of high voltage. FIG. 3 is a waveform diagram of key nodes of a measurement circuit. The signals in FIG. 2 correspond to signals in FIG. 1. H and L represent a high level and a low level in the logic circuit respectively, $V_{DC}$ is a direct current bus voltage, $V_{GP}$ is a high level of an IGBT drive circuit, which is 20 V in this circuit, $V_{GN}$ is a low level of an IGBT drive circuit, which is −8 V in this circuit, and $V_{miller}$ is a Miller platform voltage. $V_{TH}$ is a threshold voltage of the low voltage MOSFET $M_1$, $V_{RD}$ is a voltage of the auxiliary voltage source VDD, and $V_{ON}$ is an on-state voltage drop of the switching diode $D_1$. To avoid interference to a circuit caused by a certain time required by the voltage of the IGBT to be dropped from the bus voltage to the on-state voltage drop, a delay is added to a control signal of the low-voltage MOSFET $M_1$ in the turn-on transient of the IGBT to avoid the influence of high voltage on measurement, and the specific delay time is designed according to the actual voltage change time of the used IGBT to ensure that the voltage is completely dropped to the on-state voltage drop in a delay time period. Meanwhile, it should be noted that, since the auxiliary voltage source VDD that forces the switching diode $D_1$ to reverse bias is only a voltage slightly higher than the on-state voltage drop, even if the low-voltage MOSFET $M_1$ does not switch, the measurement of the on-state voltage drop is not affected; however, if the low-voltage MOSFET $M_1$ is not turned on when the IGBT is turned off, the test point is clamped to the voltage of the auxiliary voltage source VDD plus the diode on-state voltage drop, thus affecting the response speed of the circuit.

When the IGBT is turned on, the low voltage MOSFET $M_1$ is turned off, as shown in FIG. 2(b). According to Kirchhoff's law, the test point voltage $v_{TP}$ and the circuit node voltage $v_D$ may be represented as:

$$V_{TP}(s) = \frac{sC_R R_L v_D(s) + v_{CE-ON}(s)}{sC_R R_L + sC_S R_L + 1}$$

$$v_D(s) = \frac{sC_R R_3 v_{TP}(s) + V_{RD}}{sC_O R_3 + sC_R R_3 + 1}$$

wherein $C_R$, $R_L$, $C_S$, $C_O$, and $R_3$ are all circuit parameters in the circuit in FIG. 1. $V_{RD}$ is a voltage value of the voltage source VDD in FIG. 1.

It can be seen that the test point voltage $v_{TP}$ presents a first-order low-pass filtering characteristic to the on-state voltage drop $v_{CE-ON}$, and a first-order high-pass filtering characteristic to the node voltage $v_D$. The node voltage $v_D$ presents a high-pass filtering characteristic to the test point voltage $v_{TP}$ and a low-pass filtering characteristic to the voltage value $V_{RD}$ of the voltage source VDD. The current-limiting resistor $R_3$ is only a current-limiting resistor of several hundred ohms, the voltage value $V_{RD}$ of the voltage source VDD is constant. Therefore, the node voltage $v_D$ may be considered to be a constant value during the entire low-voltage MOSFET $M_1$ turn-off time, and the test point voltage $v_{TP}$ may be equivalent to a first-order low-pass filtering link for the on-state voltage drop $v_{CE-ON}$, which may be simplified as:

$$v_{TP}(s) = \frac{v_{CE-ON}(s)}{sC_R R_L + sC_S R_L + 1}$$

The actual devices such as diodes and operational amplifiers all have certain leakage currents, when the leakage current is considered, the expression of the test point voltage $v_{TP}$ is as follows:

$$v_{TP}(s) = \frac{v_{CE-ON}(s) R_J}{s(C_R + C_S) R_L R_J + 2R_L + R_J}$$

wherein $R_J$ is an equivalent resistance of a leakage current in a diode.

According to the expression of the node voltage, in the case of a direct current circuit breaker or a resistive load, the on-state voltage drop is basically a constant value, and for a constant on-state voltage drop, an error may be represented as:

$$v_{ERR-C} = \lim_{t \to \infty} (v_{CE-ON}(t) - v_{TP}(t)) = \frac{2R_L}{2R_L + R_J} v_{CE-ON}$$

In an actual converter, an inductor is often an indispensable passive device. In a case of an inductive load, a collector current $i_C$ is a ramp signal, a responsive on-state voltage drop is also approximated by a ramp signal, and an error may be represented as:

$$v_{ERR-V} = k_n \frac{V_{LD}}{L_D} \frac{R_L R_J^2 (C_R + C_S)}{(R_L + 2R_J)^2} + \frac{2R_L}{2R_L + R_J} v_{CE-ON}$$

It can be seen that, due to the first-order low-pass filtering characteristic of the measurement circuit, when a constant on-state voltage drop is tracked, the error is only from the equivalent resistance caused by the leakage current in the diode, and when the on-state voltage drop of a ramp signal is tracked, since the first-order circuit link cannot complete the no-difference tracking of the ramp signal, the measurement error is divided into two parts, namely, the error caused by the leakage current in the diode and the error caused by the circuit tracking.

Further, according to a power rating of an actual device, high-resistance series high-voltage resistors $R_L$ with different resistances are selected. Since the high-resistance series high-voltage resistor $R_L$ bears the bus voltage when the IGBT is turned off, it is necessary to ensure that the power and the withstand voltage of the resistor have a sufficient safety margin. According to an actual requirement, a power dissipation on the resistor is limited to a constant value, and a resistance of the high-resistance series high-voltage resistor $R_L$ is calculated using the power dissipation combined with an isolation voltage, specifically:

$$R = \frac{V_{CE}}{P}$$

wherein P is an allowed power dissipation on the resistor and is selected to be 4 W in this embodiment, which may be adjusted in practice according to the requirements of the circuit diagram and the heat dissipation conditions. $V_{CE}$ is a voltage between the collector and the emitter.

Further, according to the above error analysis, the most important parameter indexes for the selection of the switching diodes $D_1$ and $D_2$ are the leakage current and the junction capacitance $C_R$, and the stability of the parameters to the temperature is also a factor affecting the circuit performance, so that the leakage current and the junction capacitance $C_R$ are required to be as small as possible, and the parameter is required to change as little as possible with temperature. In practice, a switching diode with a withstand voltage of around 90 V and a rated current level of mA can meet these requirements, and no special requirements are required for the selection of the switching diode.

Further, for the selection of the operational amplifier $U_3$, since the tracking parameters are static parameters, there are no strict requirements for the bandwidth of the operational amplifier, but the input impedance is required to be large enough and the input bias current is required to be small. In practice, the operational amplifier $U_3$ is required to have a bandwidth of 1 MHz or more, an input impedance of more than 1000 MΩ, an input capacitance of 4 pF or less, and an input bias current level of nA. Since the operational amplifier $U_3$ is already used as a voltage follower at the previous stage, the isolation operational amplifier $U_4$ only needs to meet the requirement of the system for isolation voltage and has no special requirement for the operational amplifier performance.

Further, for the parameter selection of the RC delay circuit, during the IGBT turn-on/turn-off transient, it takes a certain amount of time for the collector-emitter voltage of the IGBT to change from the bus voltage to the on-state voltage drop. During the turn-on transient of the IGBT, the voltage between the collector and the emitter of the IGBT is dropped from the bus voltage to the on-state voltage drop. To avoid the influence of the high voltage between the collector and the emitter on the measurement, a delay needs to be added to the low-voltage MOSFET $M_1$ in this case, so that the circuit starts to track the on-state voltage drop after the voltage between the collector and the emitter of the IGBT is dropped to the on-state voltage drop. When the IGBT is turned off, the control signal arrives earlier than the rise of the collector-emitter voltage, so that the circuit is not interfered, and special treatment is not required. FIG. 3 shows waveforms of the operating state of the circuit at key nodes during the IGBT turn-on and turn-off process. The delay time of the RC delay circuit may be represented as:

$$T_D = RC$$

In practice, this delay time is related to the change time of the voltage between the collector and the emitter of the IGBT and needs to be adjusted according to the switching speed of the IGBT, which is set to about 2 us to fully meet the requirements. The specific values of the parameters of the capacitor and the resistor may be calculated according to a formula.

Step 2: measuring a collector current $i_C$ and an on-state voltage drop model at different junction temperatures under an offline condition, and providing a calculation model for online monitoring.

It is generally considered that after the IGBT operates in the saturation region, the on-state voltage drop $v_{CE-ON}$ is represented as:

$$v_{CE-ON} = \frac{mkT_j}{q}\ln\left(\frac{i_C}{i_S}+1\right) + i_C(R_N + R_{CH})$$

wherein m is an injection coefficient, k is a Boltzmann constant, $T_j$ is a junction temperature, q is a charge, $i_C$ is the collector current, $i_S$ is a reverse saturation current, $R_N$ is a module package resistance of the IGBT module, and $R_{CH}$ is an internal on-resistance of the IGBT.

A partial derivative of the collector current $i_C$ is calculated for the on-state voltage drop $v_{CE-ON}$, wherein a change rate of the on-state voltage drop $v_{CE-ON}$ to the collector current $i_C$ is represented as:

$$k_{CE} = \frac{\partial v_{CE-ON}}{\partial i_C} = \frac{nkT_j}{qi_S}\frac{1}{i_C + i_S} + (R_N + R_{CH})$$

It can be seen that the change rate of the on-state voltage drop $v_{CE-ON}$ to the collector current $i_C$ changes with $i_C$; when the collector current $i_C$ is within a small change range, the change rate is regarded as a constant, and the on-state voltage drop is represented by piecewise linearization based on the collector current $i_C$ as follows:

$$v_{CE-ON}(i_C) = k_n i_C + V_{INT-n} \quad n = 1, 2 \ldots n$$

wherein $k_n$ is the change rate of on-state voltage drop $v_{CE-ON}$ to the collector current $i_C$ within different collector current $i_C$ ranges, which is a specific value of $k_{CE}$ in a certain collector current $i_C$ region, and n represents different current ranges; $V_{INT-n}$ is a constant term of an expression in each collector current $i_C$ range; $k_n$ and $V_{INT-n}$ are different in different collector current $i_C$ ranges; for $k_n$, when the collector current $i_C$ is within a small change range, $k_n$ is considered to be a constant independent of the collector current $i_C$ but related to the junction temperature $T_j$ according to $k_{CE}$ expression.

Based on the piecewise linearization in the previous analysis, the basic principle of calculating $k_n$ may be represented as:

$$k_n = \frac{\Delta v_{CE-ON}}{\Delta i_C}$$

In practical applications, noise is inevitable. To enhance the anti-interference capability, $k_n$ is calculated using a least square method by sampling the on-state voltage drop $v_{CE-ON}$ and the collector current $i_C$ multiple times within a certain current range and is represented as:

$$k_n = \frac{\overline{v_{CE-ON} i_C} - \overline{v_{CE-ON}} \overline{i_C}}{\overline{i_C^2} - (\overline{i_C})^2}$$

a fitting coefficient $R_n^2$ is represented as:

$$R_n^2 = 1 - \frac{\sum (v_{CE-ON} - \overline{v_{CE-ON}})^2}{\sum (v_{CE-ON} - f(i_C))^2}$$

Figure 4:
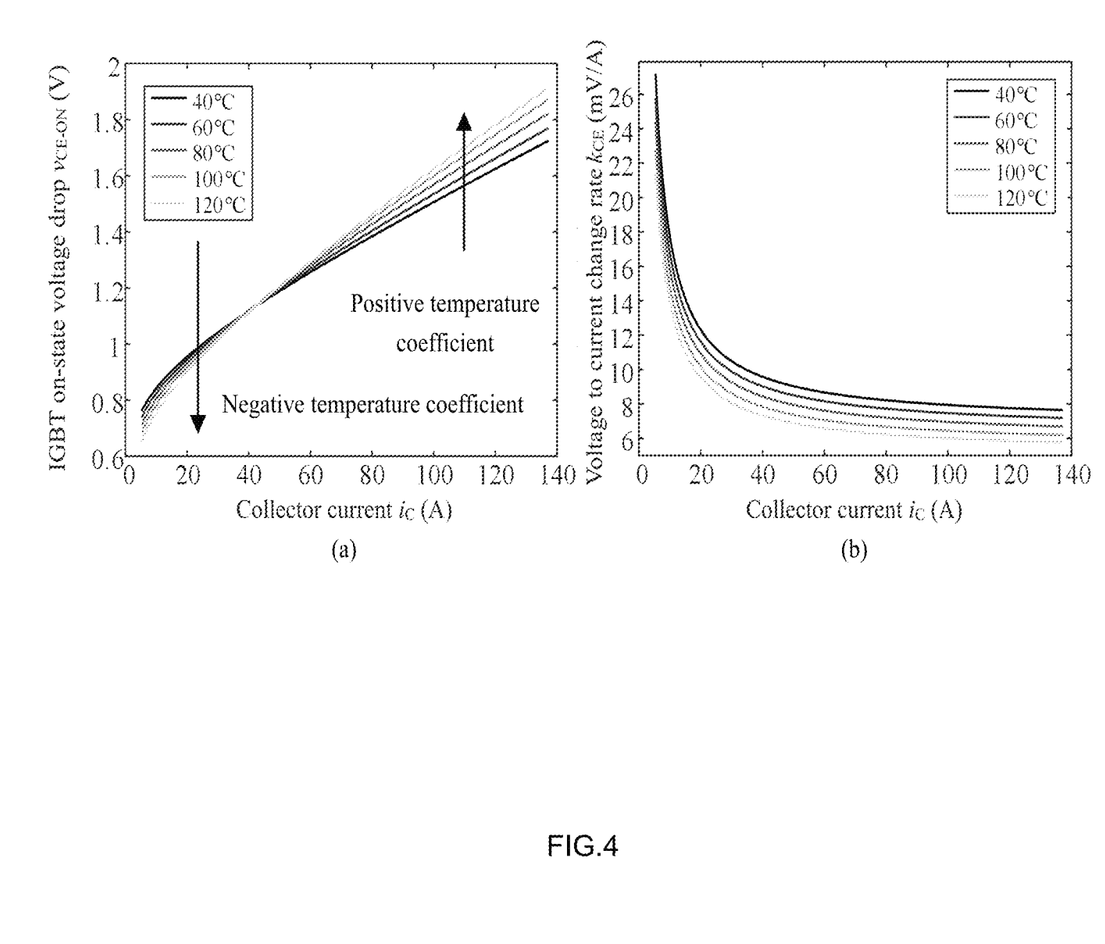
FIG. 4 is a schematic diagram of output characteristics of IGBT at different temperatures and a change rate of on-state voltage drop to a collector current at different currents.

FIG. 4 shows output characteristics of IGBT at different temperatures and a change rate of on-state voltage drop to a collector current at different currents. It can be seen that the on-state voltage drop of the IGBT has a distinct positive temperature coefficient region and a distinct negative temperature coefficient region at different currents, and the turning point of the two regions is about 45 A. The on-state voltage drop has a positive temperature coefficient for the change rate of the collector current $i_C$ over the entire current range and remains basically stable at high currents.

Figure 5:
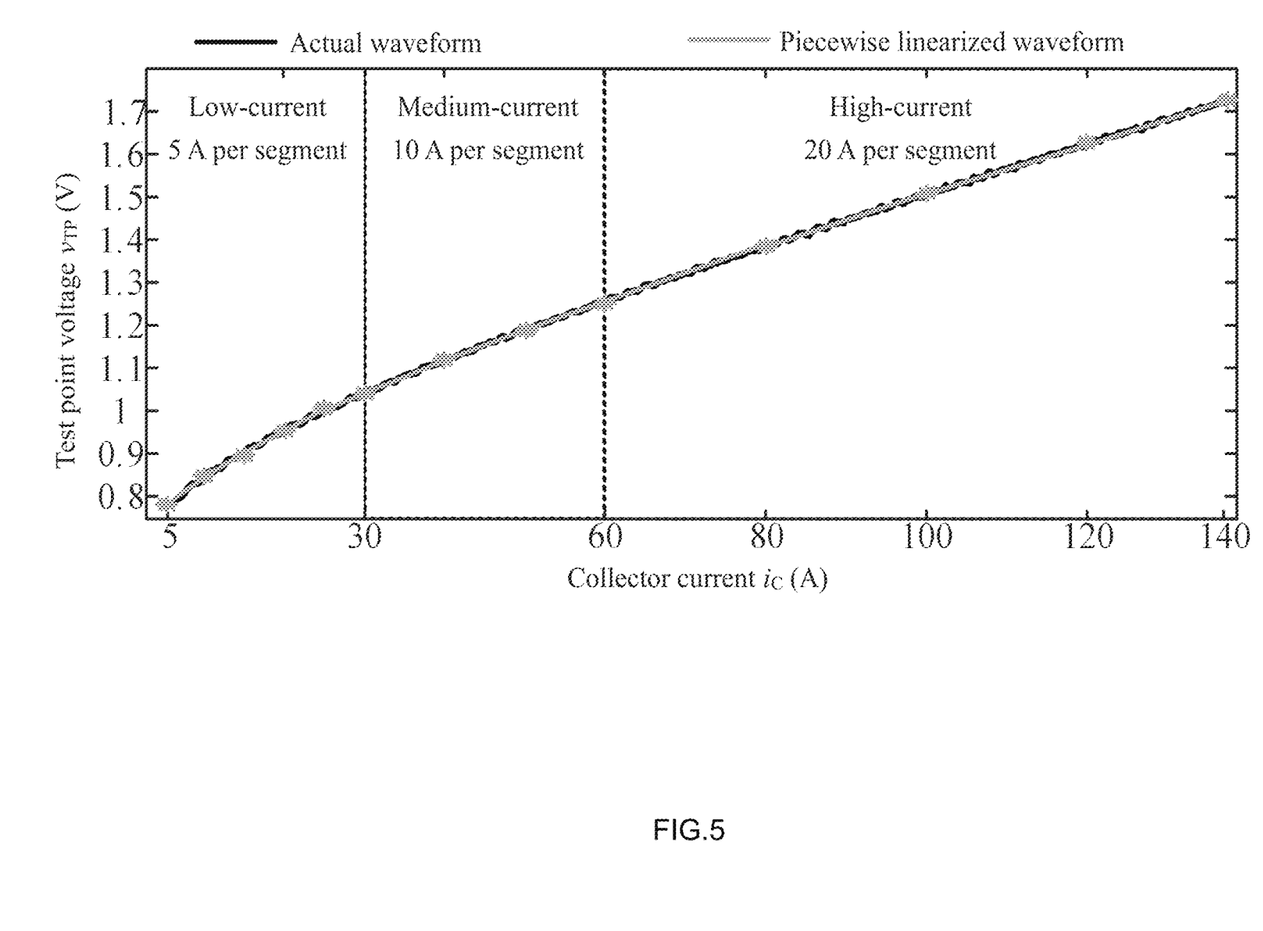
FIG. 5 is a schematic diagram of a comparison between an actual output characteristic curve and a linearized output characteristic curve within a full current range.

The actual waveform and linearized waveform of the test point voltage $v_{TP}$ in the full current range are shown in FIG. 5. It can be seen that the collector current $i_C$ is divided into 3 phases, a low-current phase (5 A to 30 A), a medium-current phase (30 A to 60 A) and a high-current phase (greater than 60 A). Every 5 A is set as a current interval in the low-current phase, every 10 A is set as a present interval in the medium-current phase, and every 20 A is set as an existing interval in the high-current phase. It can be seen that the linearized waveform has a good description.

Figure 6:
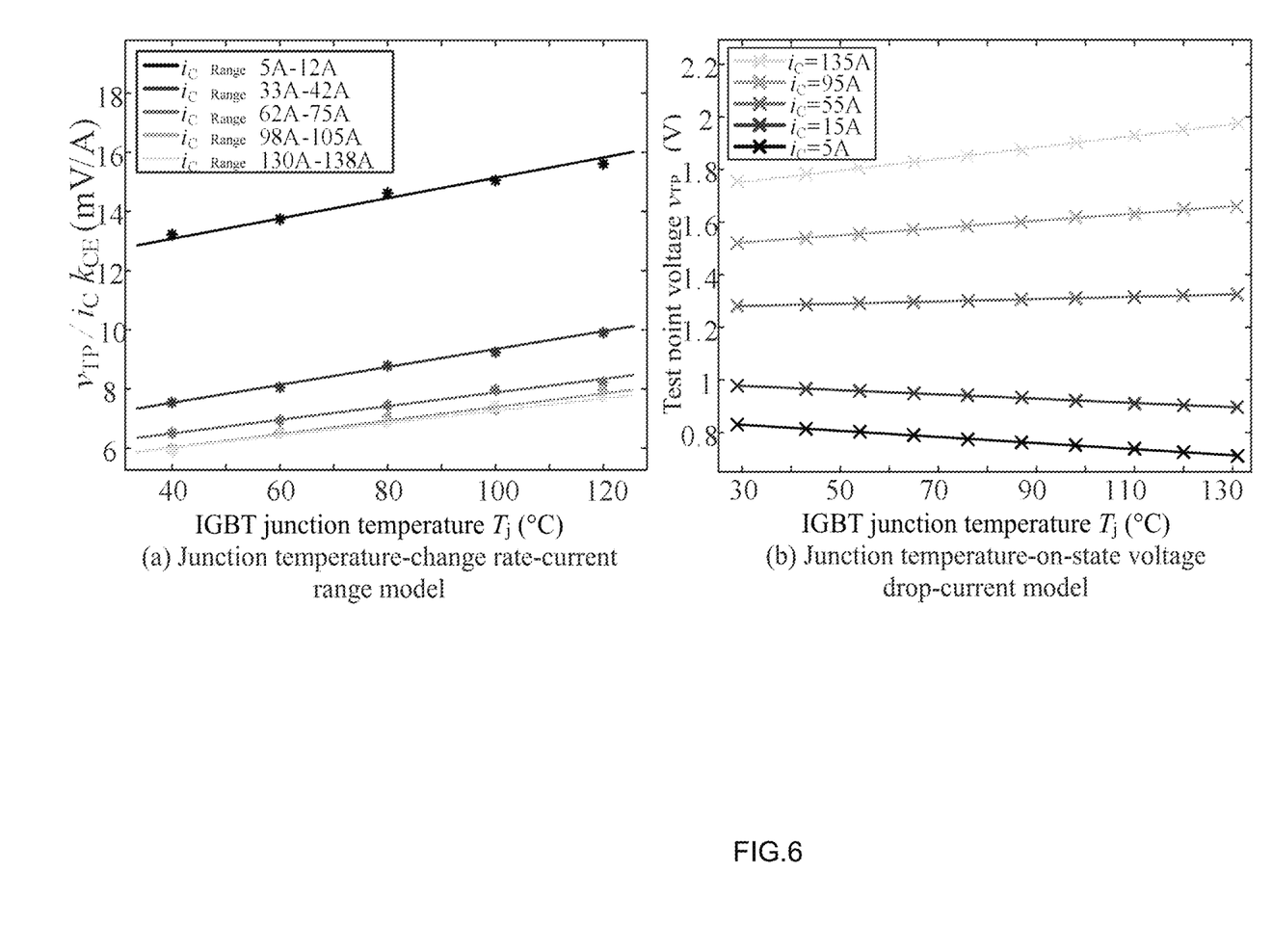
FIG. 6 is a schematic diagram of a junction temperature-current segment-on-state voltage drop versus a current change rate model and a junction temperature-on-state voltage drop-current model.

FIG. 6 is a schematic diagram of a junction temperature-current segment-on-state voltage drop versus a current change rate model and a junction temperature-on-state voltage drop-current model. In inductive loads, there is a stable error between the on-state voltage drop $v_{CE-ON}$ and the test point voltage $v_{TP}$, so $k_n$ is used as a thermal parameter. It can be seen that $k_n$ in the low-current range is much greater than that in the high-current range, and $k_n$ remains basically stable in the high-current region. When the current range is divided, in low currents, the current range needs to be very narrow, and in high currents, the current range may be wider.

Step 3: performing online monitoring on the junction temperature under online conditions based on the model obtained from offline condition testing.

Figure 7:
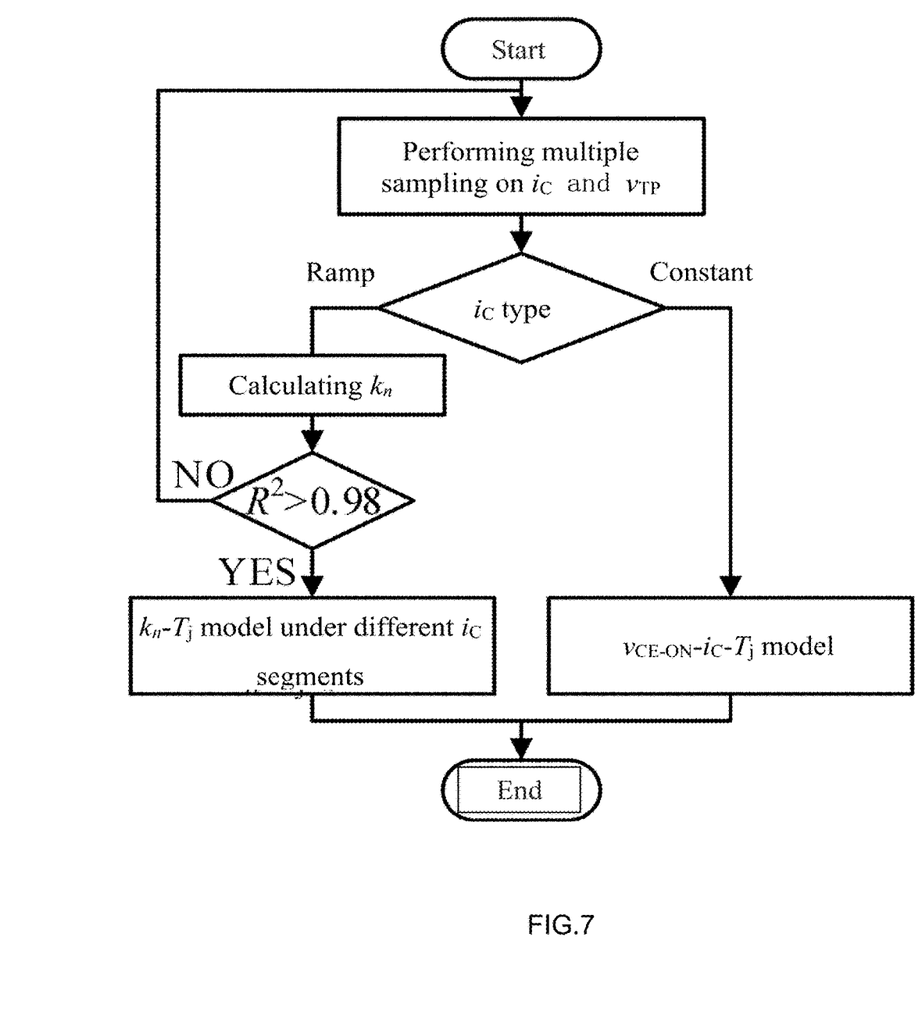
FIG. 7 is a flow chart of a junction temperature online monitoring strategy.

FIG. 7 shows a flow chart of a junction temperature online monitoring strategy. In an actual process, a circuit has large ripple interference, so that the reliability of data is improved by judging a fitting coefficient $R^2$, and the monitoring accuracy is further improved.

Figure 8:
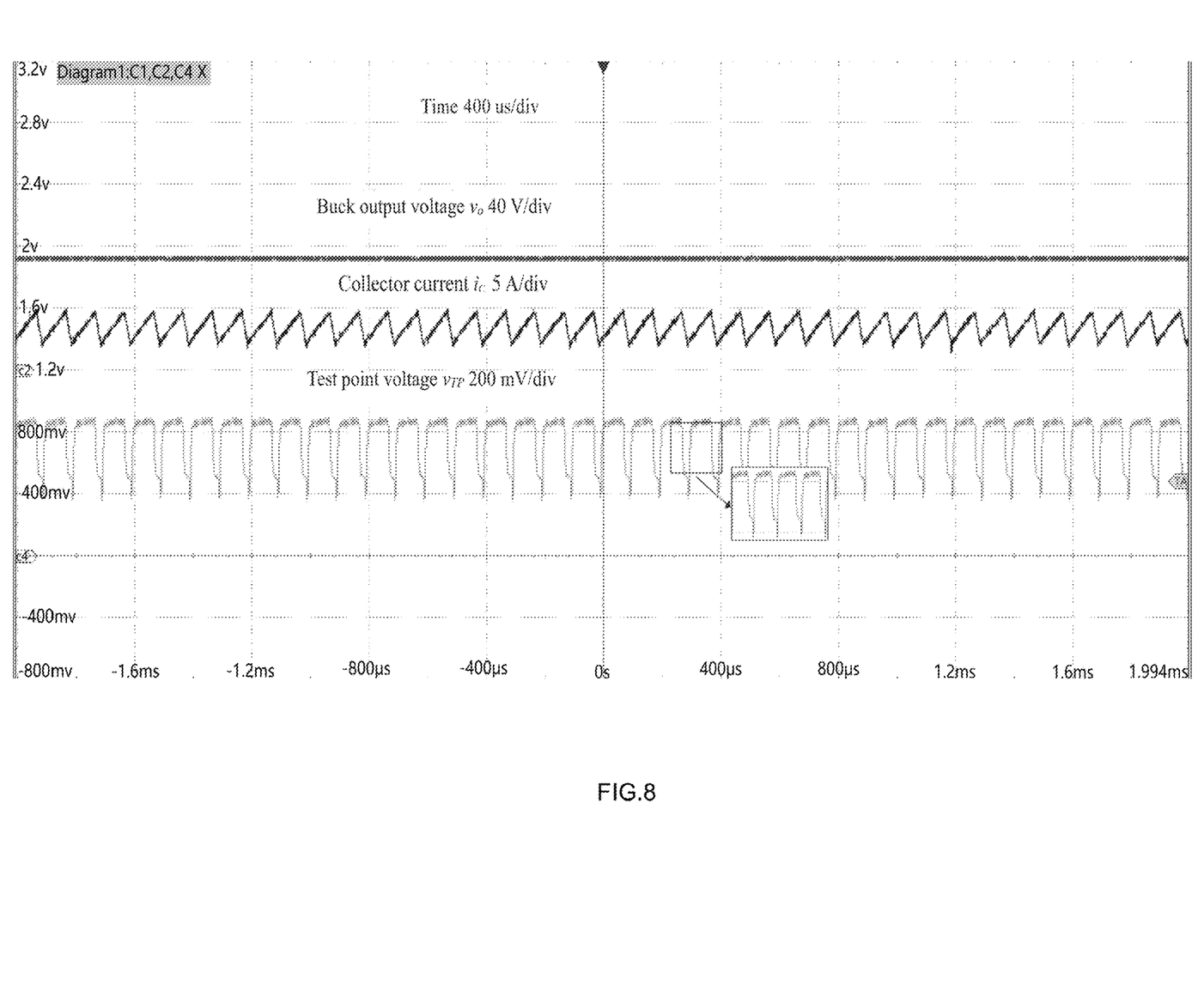
FIG. 8 is a waveform during junction temperature online monitoring.
Figure 9:
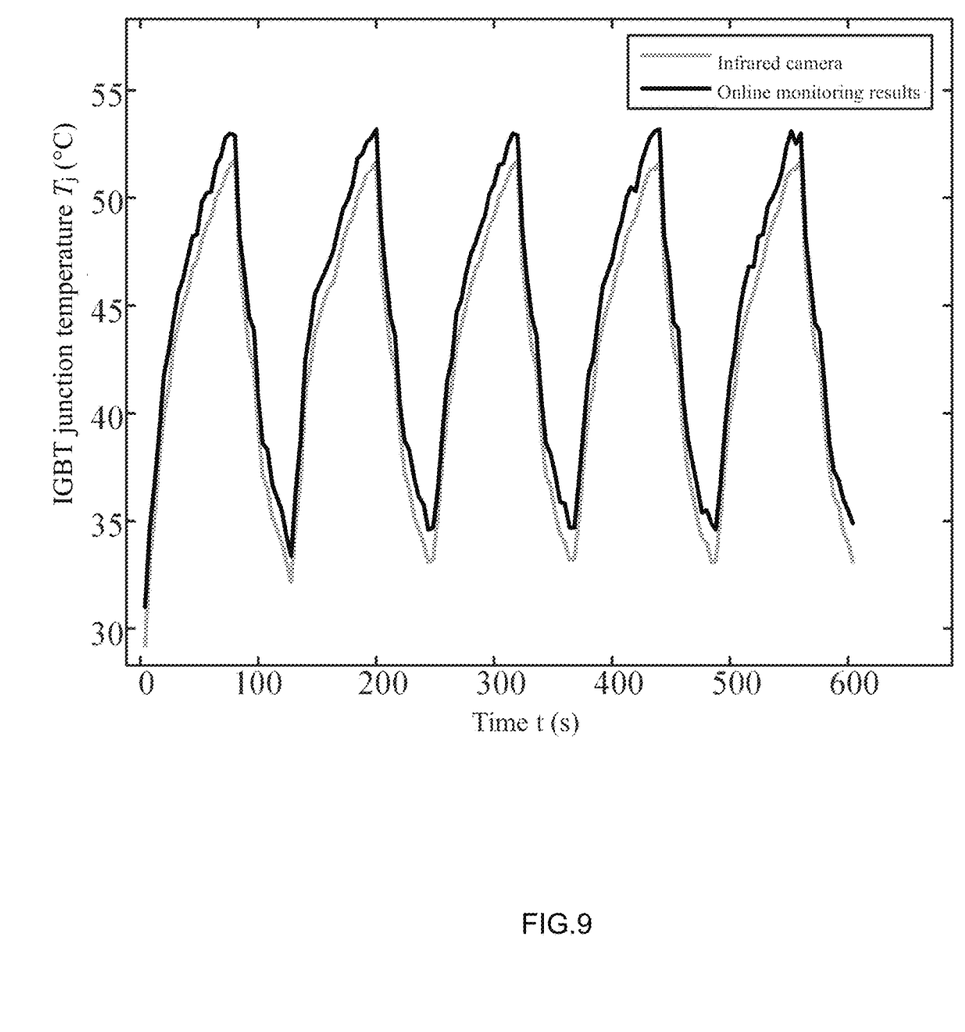
FIG. 9 is a schematic diagram of a comparison between monitoring results during the junction temperature online monitoring process and measurement results of an infrared camera

In the online monitoring experiment, a power cycle experiment based on a Buck circuit is used to verify the online monitoring effect of the proposed monitoring circuit and monitoring method on the junction temperature. The Buck power cycle test bench dissipates heat from the IGBT by a heat sink, and a temperature of the IGBT is increased or decreased when the IGBT is running continuously by changing a power of the heat sink. In the present invention, the IGBT is set to have a cycle of 60 s, with 40 s for temperature increase and 20 s for temperature decrease. FIG. 8 is a waveform during junction temperature online monitoring, and FIG. 9 is a schematic diagram of a comparison between monitoring results during the junction temperature online monitoring process and measurement results of an infrared camera. It can be seen that the online monitoring strategy has a good effect on junction temperature online monitoring, and the error of the monitored temperature does not exceed 3.5° C. at most.

What is claimed is:

1. A resistor voltage-bearing type on-state voltage drop measurement circuit for junction temperature monitoring, comprising: a high-resistance series high-voltage resistor, a first switching diode, a second switching diode, a low-voltage MOSFET, an inverter, a three-state gate, an RC delay circuit consisting of a resistor and a capacitor, a current-limiting resistor, an additional current-limiting resistor, auxiliary voltage sources VDD and VCC, an operational amplifier, and an isolation operational amplifier;

wherein one end of the high-resistance series high-voltage resistor is connected to a collector of an IGBT, the other end of the high-resistance series high-voltage resistor is connected to a positive electrode of the first switching diode, a negative electrode of the first switching diode is connected to a drain of the low-voltage MOSFET, and a source of the low-voltage MOSFET is connected to an emitter of the IGBT;

a connection between the positive electrode of the first switching diode and the high-resistance series high-voltage resistor is a test point and is connected to an input end of the operational amplifier of an isolation part, a negative electrode of the second switching diode is connected to the test point, and a positive electrode of the second switching diode is connected to power reference ground; and the auxiliary voltage source VDD is connected to the negative electrode of the first switching diode by the additional current-limiting resistor;

in a circuit of a logic part, an input signal of the circuit is obtained by inverting a first signal of the IGBT that is sent by a controller, by the inverter, and then the input signal is input to an input end of the three-state gate by the series RC delay circuit, and an input signal of a control end of the three-state gate is the first signal of the IGBT sent by a controller; after passing through the three-state gate, input signal of the IGBT becomes a signal with a delay added to a falling edge after inversion, and the input signal is finally used for switching control of the low-voltage MOSFET;

in a circuit of the isolation part, an input signal of the isolation part is from a test point voltage of a measurement part, and the operational amplifier is connected as a voltage follower, and a voltage of the voltage follower is finally used for on-state voltage drop detection by the isolation operational amplifier; and the measurement circuit also has an output parasitic capacitance from the low-voltage MOSFET, a junction capacitance of the first switching diode and the second switching diode, an input capacitance of the operational amplifier and a PCB parasitic capacitance, which are connected to the test point.

2. The resistor voltage-bearing type on-state voltage drop measurement circuit for junction temperature monitoring according to claim 1, wherein when the IGBT is on-state, the low-voltage MOSFET is turned off according to the second signal, the first switching diode is in a reverse bias state, and the test point voltage is equivalent on-state voltage drop;

when the IGBT is turned off, the low-voltage MOSFET is turned on and turned off according to the second signal, the first switching diode is in a forward bias state, high voltage between the collector and the emitter of the IGBT is born by the high-resistance series high-voltage resistor, and the test point voltage is clamped to the on-state voltage drop of the second switching diode; and during a process of turning on and turning off of the IGBT, the high-resistance series high-voltage resistor bears high voltage only in a IGBT turn-off process and does not bear high voltage in other periods; and a control signal of the low-voltage MOSFET is formed by the second signal of the IGBT after conditioning of the logic part.

3. An IGBT junction temperature online monitoring method based on the resistor voltage-bearing type on-state voltage drop measurement circuit according to claim 1, comprising the following steps:

step 1: designing an on-state voltage drop sampling circuit based on the high-resistance series high-voltage resistor and selecting parameters according to an actual application scenario;

according to a power rating of an actual device, high-resistance series high-voltage resistors with different resistances are selected to limit a power dissipation on the high-voltage resistors to a constant value, a resistance of the high-resistance series high-voltage resistor is calculated using the power dissipation combined with an isolation voltage, specifically:

$$R = \frac{V_{CE}}{P}$$

wherein P is an allowed power dissipation on the high-voltage resistors, and $V_{CE}$ is a voltage between the collector and the emitter of the IGBT;

for the first switching diode and the second switching diode, any switching diode with a withstand voltage of about 90 V and a rated current level of mA meets requirements;

the operational amplifier requires a bandwidth of more than 1 MHZ, an input impedance greater than 1000 MΩ, an input capacitance of less than 4 PF, and an input bias current level of nA; and the isolation operational amplifier only needs to meet a requirement of a system on isolation voltage;

for parameter selection of the RC delay circuit, a delay is added to the low-voltage MOSFET when the IGBT is turned on, and a delay time of the RC delay circuit is represented as:

$$T_D = RC$$

specific values of parameters of the capacitor and the resistor may be calculated according to a formula;

step 2: measuring a collector current and an on-state voltage drop model at different junction temperatures under an offline condition, and providing a calculation model for online monitoring;

when IGBT operates in a saturation region, the on-state voltage drop is represented as:

$$v_{CE-ON} = \frac{mkT_j}{q} \ln\left(\frac{i_C}{i_S} + 1\right) + i_C(R_N + R_{CH})$$

wherein m is an injection coefficient, k is a Boltzmann constant, $T_j$ is a junction temperature, q is a charge, $i_C$ is the collector current, $i_S$ is a reverse saturation current, $R_N$ is a module package resistance of an IGBT, and $R_{CH}$ is an internal on-resistance of the IGBT;

a partial derivative of the collector current is calculated for the on-state voltage drop, wherein a change rate of the on-state voltage drop to the collector current is represented as:

$$k_{CE} = \frac{\partial v_{CE-ON}}{\partial i_C} = \frac{nkT_j}{qi_S} \frac{1}{i_C + i_S} + (R_N + R_{CH})$$

wherein the change rate of the on-state voltage drop to the collector current is changed with the collector current; when the collector current is within a small change range, the change rate is regarded as a constant, and the on-state voltage drop is represented by piecewise linearization based on the collector current as follows:

$$v_{CE-ON}(i_C) = k_n i_C + V_{INT-n} \quad n = 1, 2 \dots n$$

wherein $k_n$ is the change rate of on-state voltage drop to the collector current within different collector current ranges, which is a specific value of $k_{CE}$ in a certain collector current region, and n represents different current ranges; $V_{INT-n}$ is a constant term of an expression in each collector current range; $k_n$ and $V_{INT-n}$ are different in different collector current ranges; for $k_n$, when the collector current is within a small change range, $k_n$ is considered to be a constant independent of the collector current but related to the $T_j$ according to $k_{CE}$ expression;

$k_n$ is calculated using a least square method by sampling the on-state voltage drop and the collector current multiple times within a certain current range and is represented as:

$$k_n = \frac{\overline{v_{CE-ON} i_C} - \overline{v_{CE-ON}}\, \overline{i_C}}{\overline{i_C^2} - (\overline{i_C})^2}$$

a fitting coefficient $R_n^2$ is represented as:

$$R_n^2 = 1 - \frac{\sum(v_{CE-ON} - \overline{v_{CE-ON}})^2}{\sum(v_{CE-ON} - f(i_C))^2}$$

step 3: performing online monitoring on the junction temperature under online conditions based on the collector current and the on-state voltage drop model obtained from offline condition testing;

in an online monitoring experiment, a power cycle experiment based on a Buck circuit is used to verify an online monitoring effect of a proposed monitoring circuit and monitoring method on the junction temperature, the Buck power cycle test bench dissipates heat from the IGBT by a heat sink, and a temperature of the IGBT is increased or decreased when the IGBT is running continuously by changing a power of the heat sink.

* * * * *